(12) United States Patent
Haseyama et al.

(10) Patent No.: US 6,512,386 B2
(45) Date of Patent: *Jan. 28, 2003

(54) DEVICE TESTING CONTACTOR, METHOD OF PRODUCING THE SAME, AND DEVICE TESTING CARRIER

(75) Inventors: Makoto Haseyama, Kawasaki (JP); Shigeyuki Maruyama, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/333,984

(22) Filed: Jun. 16, 1999

(65) Prior Publication Data

US 2002/0140444 A1 Oct. 3, 2002

(30) Foreign Application Priority Data

Dec. 22, 1998 (JP) ............................. 10-365587

(51) Int. Cl.[7] .......................... G01R 31/02; H01R 9/00; H05K 1/00
(52) U.S. Cl. .................... 324/754; 324/757; 29/842; 439/71
(58) Field of Search ................ 324/754, 755, 324/757, 758, 765; 439/70, 71, 72; 29/842, 843

(56) References Cited

U.S. PATENT DOCUMENTS

| | | | | | |
|---|---|---|---|---|---|
| 4,897,602 | A | * | 1/1990 | Lin et al. | 324/754 |
| 5,088,190 | A | * | 2/1992 | Malhi et al. | 29/843 |
| 5,208,529 | A | * | 5/1993 | Tsurishima | 324/754 |
| 5,317,255 | A | * | 5/1994 | Suyama | 324/754 |
| 5,691,650 | A | * | 11/1997 | Sugai | 324/755 |
| 5,848,465 | A | * | 12/1998 | Hino et al. | 29/825 |
| 6,060,891 | A | * | 5/2000 | Hembree | 324/754 |
| 6,166,556 | A | * | 12/2000 | Wang et al. | 324/765 |

* cited by examiner

Primary Examiner—N. Le
Assistant Examiner—Anjan K. Deb
(74) Attorney, Agent, or Firm—Armstrong, Westerman & Hattori, LLP

(57) ABSTRACT

A contactor used for testing a semiconductor device is provided. The semiconductor device testing contactor is electrically connected to electrodes of a semiconductor device to be tested. Such a contactor includes a wiring board and a first reinforcing member for reinforcing the wiring board. The contactor has a flexible base film and device connecting pads to be electrically connected to the electrodes of the semiconductor device. The first reinforcing member is disposed on the surface opposite to the semiconductor device connecting surface of the wiring board. The wiring board and the first reinforcing member are collectively bonded.

11 Claims, 11 Drawing Sheets

DEVICE TESTING CONTACTOR, METHOD OF PRODUCING THE SAME, AND DEVICE TESTING CARRIER

BACKGROUND OF THE INVENTION

1. Field of the Invention

The present invention generally relates to a semiconductor device testing contactor, a method of producing the semiconductor device testing contactor, and a semiconductor device testing carrier. More particularly, the present invention relates to a semiconductor device testing contactor which obtains electrical contact with a semiconductor device such as a bare chip, a BGA (Ball Grid Array), an SOP (Small Outline Package), or a QFP (Quad Flat Package), a method of producing such a semiconductor device testing contactor, and a semiconductor device testing carrier.

2. Description of the Related Art

In recent years, there has been an increasing demand for small, high-speed, and high-density semiconductor devices. The electrodes disposed in these semiconductor devices have become smaller accordingly. As a result, a semiconductor device testing contactor is now expected to be capable of obtaining reliable electrical connection with a small semiconductor device with small electrodes.

A semiconductor device testing contactor used for testing a semiconductor device is electrically connected to the electrodes of a semiconductor device to be tested. Such a semiconductor device testing contactor includes a wiring board having electrode pads to be electrically connected to the electrodes of the semiconductor device. As mentioned above, semiconductor devices have been becoming smaller in size, and higher in speed and density. To be compatible with such semiconductor devices, a membrane-type wiring board having a conductive pattern on a polyimide film is often employed as the wiring board of a semiconductor device testing contactor. The membrane-type wiring board has a minutely formed conductive pattern so as to be able to conform to the minute electrode pads of a semiconductor device to be tested.

Since the membrane-type wiring board has flexibility, it requires a reinforcing member when used as a semiconductor device testing contactor. For this reason, a conventional semiconductor device testing contactor has the reinforcing member for reinforcing the membrane-type wiring board.

Techniques of attaching the reinforcing member to the membrane-type wiring board include a technique using double-sided adhesive tape or adhesives (hereinafter referred to as "adhesion technique"), and a technique using screws to fasten the membrane-type wiring board to the reinforcing member (hereinafter referred to as "mechanical fastening technique").

Besides the main components (the membrane-type wiring board and the reinforcing member), the adhesion technique requires the double-sided tape or adhesives, and the mechanical fastening technique requires screws. This results in problems that the number of components becomes larger, and that the production costs of the semiconductor device testing contactor are increased.

Furthermore, when the adhesion technique or the mechanical fastening technique is employed, it is necessary to perform a double-sided adhesive tape attaching process, an adhesive applying process, or a screw tightening process. This makes the production procedures of the semiconductor device testing device more complicated.

When the adhesion technique is employed, thermal deterioration occurs to the adhesives or the double-sided tape due to the difference in thermal expansion between the membrane-type wiring board and the reinforcing member at the time of a burn-in test, for instance. The thermal deterioration of the adhesives or the double-sided adhesive tape causes wrinkles which results in a positional shift of the membrane-type wiring board with respect to the reinforcing member. With such a positional shift, there is a possibility that the conductive pattern on the membrane-type wiring board cannot be electrically connected to the electrode pads of the semiconductor device.

SUMMARY OF THE INVENTION

A general object of the present invention is to provide a device testing contactor in which the above disadvantages are eliminated.

A more specific object of the present invention is to provide a device testing contactor, a method of producing the contactor, and a device testing carrier, in which the number of components is smaller, the production procedures are simpler, and the reliability is improved.

The objects of the present invention are achieved by providing a device testing contactor which includes: a wiring board having a flexible substrate and electrode pads formed on the substrate; and a first reinforcing member which reinforces the wiring board. The electrode pads are electrically connected to the electrodes of a device. The first reinforcing member is formed by a mold. The wiring board and the first reinforcing member are collectively bonded and molded.

The objects of the present invention are also achieved by providing a device testing carrier which includes: a device testing contactor; a pressure mechanism which pushes a device toward a wiring board provided in the device testing contactor; and a cushion member which absorbs a pressing force of the pressure mechanism.

The objects of the present invention are also achieved by a method of producing a device testing contactor, which method includes the steps of: mounting a wiring board to a metal mold made up of an upper mold and a lower mold provided with a lower cavity having a shape corresponding to the shape of a first reinforcing member; and forming the first reinforcing member by injecting a reinforcing material into the metal mold, so that the wiring board and the first reinforcing member are collectively bonded.

The objects of the present invention are also achieved by a method of testing a device, which method includes the step of electrically connecting go the electrode pads of a device testing contactor to the electrodes of the device. The electrode pads are formed on the wiring board of the device testing contactor, and are reinforced by a reinforcing member. The device testing contactor has the wiring board and the reinforcing member collectively bonded to each other.

With this structure, no fixing devices, such as double-sided adhesive tape, adhesives, or screws, are necessary in fixing the wiring board and the first reinforcing member. Thus, the number of components and the production costs can be reduced. In this structure, it is not necessary to carry out an adhesion technique using double-sided adhesive tape or adhesives and a fastening technique using screws, thereby simplifying the production procedures of the device testing contactor. Also, wrinkles due to deterioration of adhesives can be prevented, and the connection reliability with the device can be improved.

The device testing carrier described above can provide the same effects as the device testing contactor.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 1A:
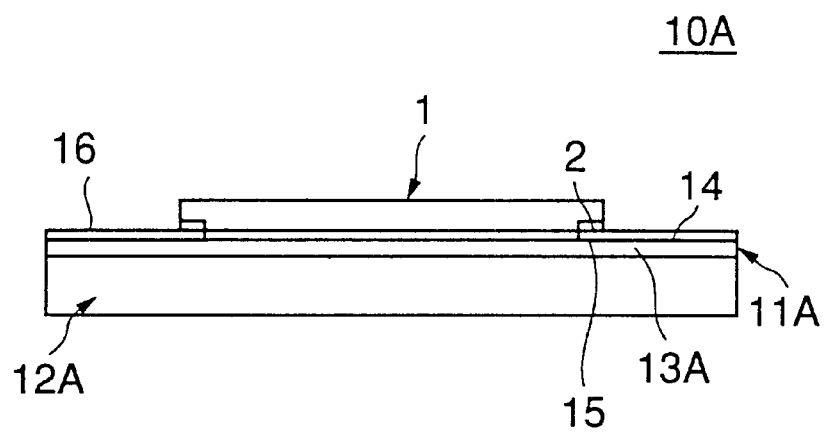
FIGS. 1A and 1B illustrate a contactor of a first embodiment of the present invention.
Figure 1B:
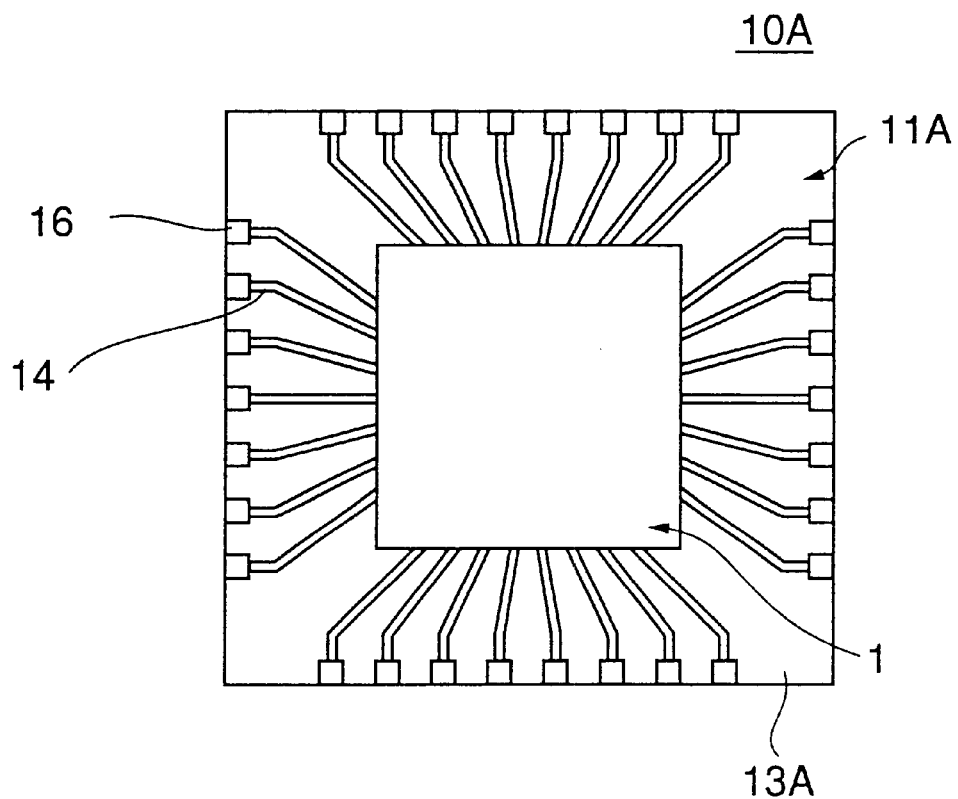

FIGS. 1A and 1B show a semiconductor device testing contactor 10A of a first embodiment of the present invention. FIG. 1A is a side view, and FIG. 1B is a plan view of the contactor 10A. In the figures, a semiconductor device 1 is mounted on the contactor 10A.

The contactor 10A is used in a test of the semiconductor device 1. The semiconductor device 1 to be tested is mounted on the contactor 10A, and various tests, such as a burn-in test, are conducted with it. The semiconductor device 1 comprises a semiconductor chip (a bare chip), a wafer, and a package structure such as BGA (Ball Grid Array), SOP (Small Outline Package), or QFP (Quad Flat Package).

The contactor 10A comprises a wiring board 11A and a first reinforcing member 12A. In this embodiment, the wiring board 11A is a membrane-type wiring board.

The wiring board 11A of the membrane type includes a base film 13A made of polyimide (PI), and a conductive pattern 14 formed on the base film 13A. The conductive pattern 14 is made of copper foil, for instance. In this structure, the wiring board 11A is flexible. Device connecting pads 15 are formed on the inner end of the conductive pattern 14, and are electrically connected to electrodes 2 disposed in the semiconductor device 1. Outer connecting pads 16 are formed on the outer end of the conductive pattern 14, and are connected to other semiconductor devices (not shown).

As the semiconductor device 1 is rapidly becoming small in size, and high in speed and density, the electrodes 2 are expected to be smaller accordingly. The membrane-type wiring board 11A of this embodiment can have a minute conductive pattern 14 and minute connecting pads 15 and 16, so as to be compatible with the semiconductor device 1 having minute electrodes 2.

The first reinforcing member 12A is disposed on the surface (rear surface) opposite to the surface (front surface) of the wiring board 11A onto which the semiconductor device 1 is connected.

The first reinforcing member 12A reinforces the wiring board 11A. With the conductive pattern 14 formed on the base film 13A, the membrane-type wiring board 11A has flexibility. Therefore, the wiring board 11A needs a reinforcing member when used as a contactor for a semiconductor device. For this reason, the first reinforcing member 12A is attached to the rear surface of the wiring board 11A so as to reinforce the wiring board 11A.

In this embodiment, the first reinforcing member 12A bonded to the rear surface of the wiring board 11 is collectively molded with the wiring board 11A. A method of collectively molding and bonding the wiring board 11A and the first reinforcing member 12A is as follows. First, a wiring board 11A is mounted to a metal mold 40A, and then a reinforcing material 45 to become the first reinforcing member 12A is injected into the metal mold 40A, so that the wiring board 11A and the first reinforcing member 12A can be collectively bonded and molded.

With the integral bonding and molding of the wiring board 11A and the reinforcing member 12A, conventionally required fixing means, such as double-sided adhesive tape, adhesives, and screws, is not necessary, thereby reducing the number of components and the producing costs. Also, wrinkles can be prevented by eliminating the use of adhesives, and the reliability of the contactor can be improved in the connection to the semiconductor device 1.

The wiring board 11A is made of a resin material such as polyimide. The reinforcing material 45 to become the first reinforcing member 12A is also made of resin. More specifically, the reinforcing material 45 is made of a resin material, such as PES, PEI, or PPE.

In this embodiment, resin materials are chosen so that the thermal expansion of the resin material to become the wiring board 11A is greater than the molding contraction of the resin material to become the first reinforcing member 12A when the first reinforcing member 12A is formed. After the molding of the first reinforcing member 12A, the wiring board 11A can always maintain tension with the first reinforcing member 12A. Thus, the wiring board 11A can be kept flat, and the electric connection with the semiconductor device 1 can be improved.

The reinforcing material 45 to become the first reinforcing member 12A is not limited to resin materials, and other materials can be used as long as the above relationship between the thermal expansion and the molding contraction is maintained. If the wiring board 11A is made of polyimide, the first reinforcing member 12A can be made of ceramic, glass, or silicon.

Figure 2A:
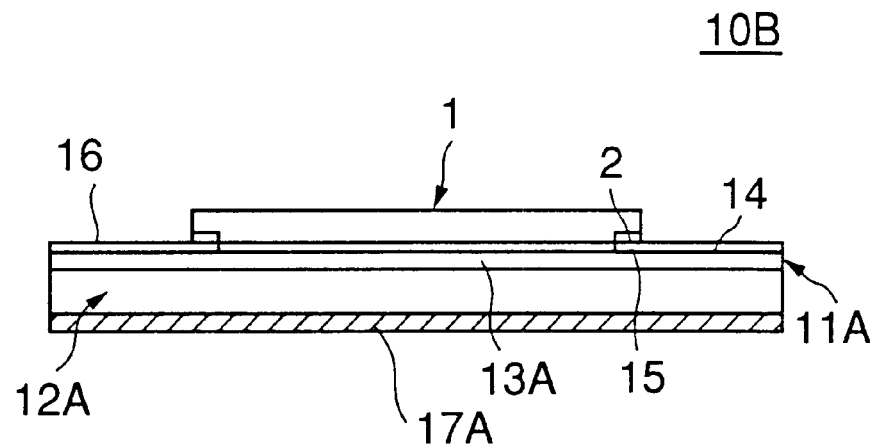
FIGS. 2A and 2B illustrate a contactor of a second embodiment of the present invention.
Figure 2B:
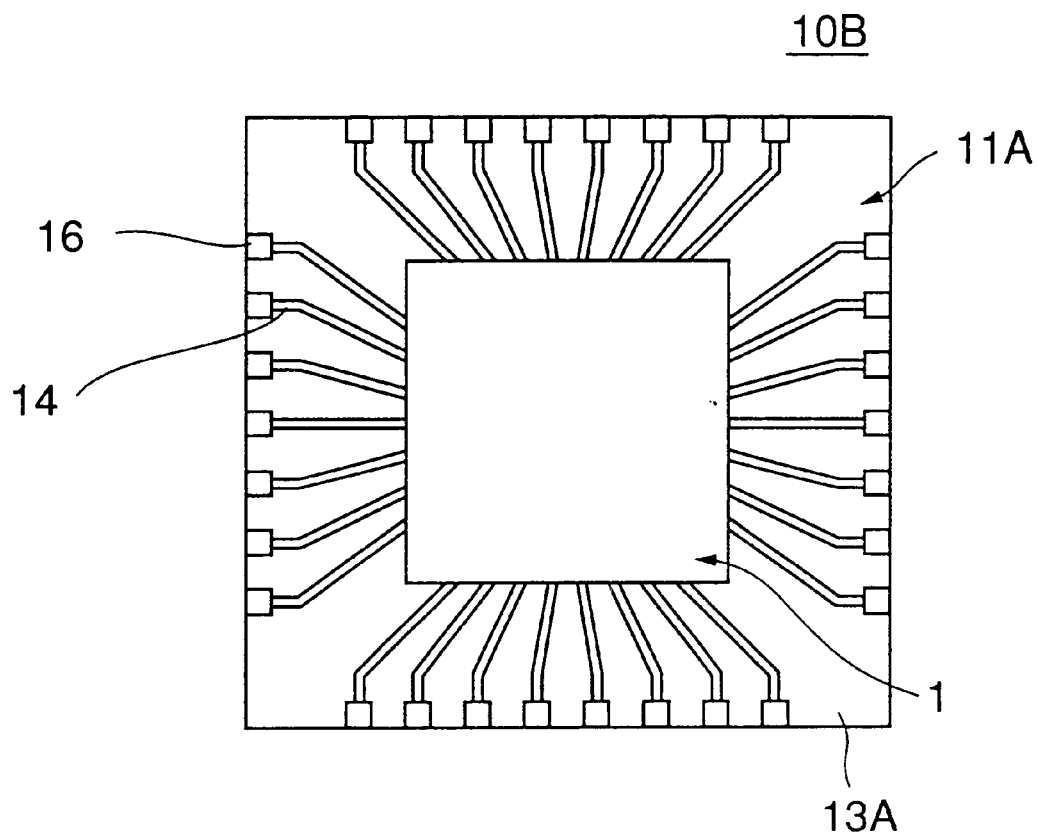

FIGS. 2A and 2B illustrate a contactor 10B of a second embodiment of the present invention. In the figures, the same reference numerals as in FIGS. 1A and 1B indicate the same components as in the contactor 10A of the first embodiment. This also applies to all embodiments described later.

The contactor 10B comprises the wiring board 11A and the first reinforcing member 12A. This contactor 10B is characterized by a core member 17A formed on the surface (lower surface) opposite to the surface of the first reinforcing member 12A to which the wiring board 11A is bonded.

The core member 17A is made of a metal such as SCCP or SUS, and is collectively molded with the first reinforcing member 12A. In this embodiment, the wiring board 11A, the first reinforcing member 12A, and the core member 17A are collectively bonded and molded. Thus, the contactor 10B has the same effects as the contactor 10A of the first embodiment of reducing the number of components and the production costs, and improving the connection with the semiconductor device 1.

The core member 17A formed on the lower surface of the first reinforcing member 12A restricts heat deformation of the first reinforcing member 12A.

As described before, resin materials are chosen so that the thermal expansion of the wiring board 11A is greater than the molding contraction of the first reinforcing member 12A when the first reinforcing member 12A is formed. After the molding of the first reinforcing member 12A, the wiring board 11A can always maintain tension with the first reinforcing member 12A. Thus, the wiring board 11A can be kept flat.

However, if the difference between the thermal expansion of the wiring board 11A and the molding contraction of the first reinforcing member 12A is too large, distortion might occur at the time of bonding and molding of the wiring board 11A and the first reinforcing member 12A.

A two-percent molding contraction normally occurs in the first reinforcing member 12A. By forming the core member 17A on the lower surface of the first reinforcing member 12A, the molding contraction of the first reinforcing member 12A can be restricted so as to reduce distortion of the first reinforcing member 12A and deformation of the wiring board 11A caused at the time of bonding and molding of the wiring board 11A and the first reinforcing member 12A. Here, a material used for the core member 17A should have a thermal expansion coefficient between the respective thermal expansion coefficients of the wiring board 11A and the first reinforcing member 12A.

In this manner, the wiring board 11A can be prevented from being deformed and kept flat, even if there is a difference between the thermal expansion coefficients of the wiring board 11A and the first reinforcing member 12A. Thus, the connecting reliability with the semiconductor device 1 can be improved.

Figure 3:
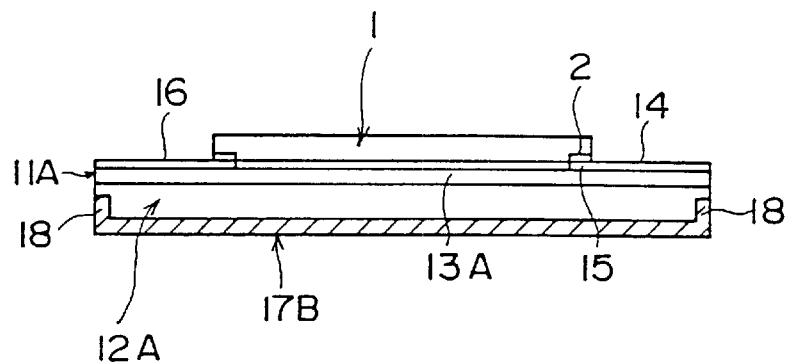
FIG. 3 illustrates a contactor of a third embodiment of the present invention.

FIG. 3 illustrates a contactor 10C of a third embodiment of the present invention. The contactor 10C of this embodiment is substantially the same as the contactor 10B of the second embodiment, except that a core member 17B has an anchor portion 18 cutting into the first reinforcing member 12A.

The anchor portion 18 is formed by the outer periphery of the core member 17B being bent upward (into the side of the first reinforcing member 12A which is bonded to the core member 17B). The anchor portion 18 can be easily formed without an increase of the production costs.

The anchor portion 18 formed on the core member 17B reinforces the bond between the first reinforcing member 12A and the core member 17B, so that distortion of the first reinforcing member 12A can be more restricted, and that deformation of the wiring board 11A can also be restricted. Thus, the wiring board 11A can be kept flat, and the connecting reliability with the semiconductor device 1 can be improved.

Figure 4A:
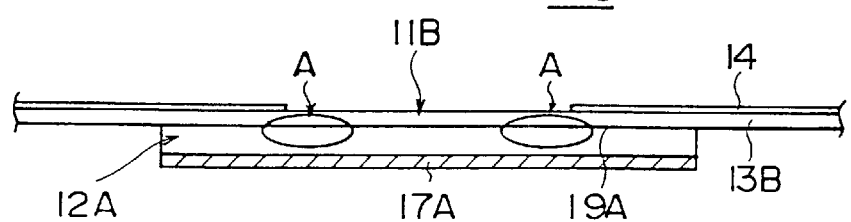
FIGS. 4A to 4C illustrate a contactor of a fourth embodiment of the present invention.
Figure 4B:
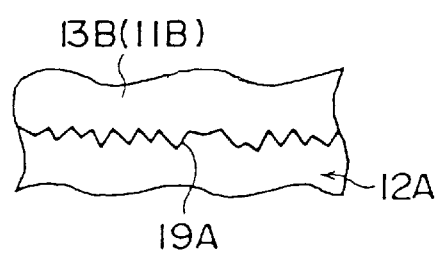
Figure 4C:
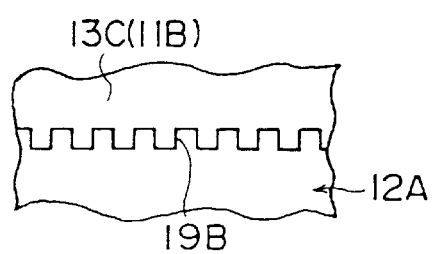

FIGS. 4A to 4C illustrate a contactor 10D of a fourth embodiment of the present invention. The contactor 10D is characterized by a bonding area increasing portion 19A formed on the entire surface or on a part of the bonding region of a wiring board 11B to which the first reinforcing member 12A is bonded. The bonding area increasing portion 19A increases the bonding area between the wiring board 11B and the first reinforcing member 12A. In this embodiment, the bonding area increasing portion 19A is formed on the entire bonding area between the wiring board 11B and the first reinforcing member 12A.

FIG. 4B is an enlarged view of the circled area indicated by an arrow A in FIG. 4A. As shown in FIG. 4B, the rear surface of a base film 13B of the wiring board 11B is made rough so as to form the bonding area increasing portion 19A. There are various ways of roughening the rear surface of the base film 13B, including an air blast method and an etching method in which the base film 13B is etched.

As described above, the adhesion between the first reinforcing member 12A and the wiring board 11B can be improved by roughening the rear surface of the base film 13B so as to increase its surface area. As the bond between the first reinforcing member 12A and the wiring board 11B is improved, the reinforcing power of the first reinforcing member 12A for the wiring board 11B is increased. Also, the wiring board 11B and the first reinforcing member 12A can be prevented from being removed from each other, and the reliability of the contactor 10D can be improved.

The structure of a bonding area increasing portion is not limited to that of the bonding area increasing portion 19A formed by roughening the rear surface of the base film 13B shown in FIG. 4B. For instance, FIG. 4C shows a bonding area increasing portion 19B having protrusions and cavities on the rear surface of the base film 13B. Small pores may be formed on the rear surface of the base film 13B so as to form a bonding area increasing portion. The roughness of the roughened surface, the height of the protrusions and the depth of the cavities, and the diameter of each pore are all adjustable, so that the bonding between the first reinforcing member 12A and the wiring board 11B can be adjusted as desired.

Figure 5:
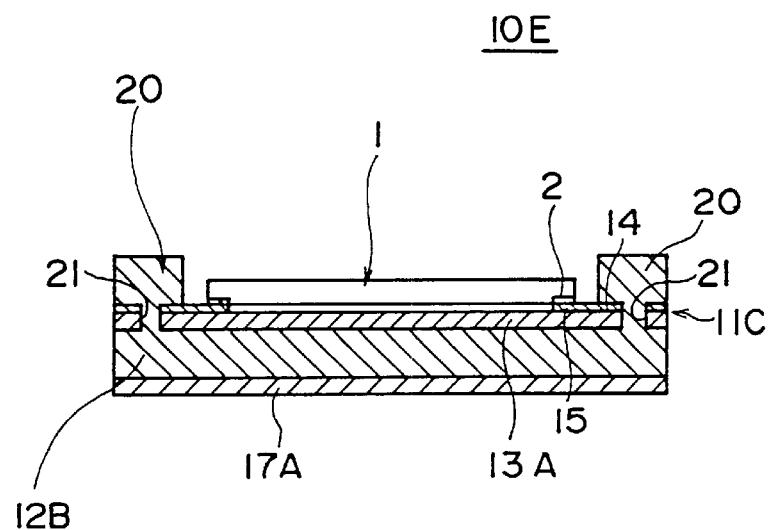
FIG. 5 illustrates a contactor of a fifth embodiment of the present invention.

FIG. 5 illustrates a contactor 10E of a fifth embodiment of the present invention. In the contactors 10A to 10D of the first to fourth embodiments, only the first reinforcing member 12A is disposed on the rear surface of the wiring board 11A or 11B. The contactor 10E of this embodiment is characterized by a second reinforcing member 20 formed on the upper surface of a wiring board 11C (on the surface opposite to the surface on which a first reinforcing member 12B is formed). The second reinforcing member 20 reinforces the wiring board 11C.

In this embodiment, the first and second reinforcing members 12B and 20 are made of the same reinforcing material 45. Holes 21 are formed in the wiring board 11C where the first reinforcing member 12B and the second reinforcing member 20 face each other. The first reinforcing member 12B and the second reinforcing member 20 are integrally connected by the holes 21. The wiring board 11C, the first reinforcing member 12B, and the second reinforcing member 20 are collectively bonded and molded.

In the contactor 10E, the wiring board 11C is sandwiched by the first reinforcing member 12B and the second reinforcing member 20, so that the wiring board 11C can be more reliably reinforced. Since the wiring board 11C, the first reinforcing member 12B, and the second reinforcing member 20 are collectively bonded and molded, the number of components and the production costs can be reduced, and the connection reliability with the semiconductor device 1 can be improved.

The bond between the first reinforcing member 12B and the second reinforcing member 20 is strengthened, because the first reinforcing member 12B and the second reinforcing member 20 are integrally connected via the holes 21 formed in the wiring board 11C. Thus, the contactor 10E is also strengthened, and the reinforcing members 12B and 20 can be surely prevented from being removed from the wiring board 11C.

Although the first reinforcing member 12B and the second reinforcing member 20 are made of the same reinforcing material in this embodiment, it is possible to form the first reinforcing member 12B and the second reinforcing member 20 from two different reinforcing materials. In such a case, there will be a difference in thermal contraction between the upper surface and the lower surface of the wiring board 11C. The first and second reinforcing members 12B and 20 can be prevented from being deformed by setting suitable thermal expansion coefficients for the respective reinforcing materials.

The holes 21 are not essential in this embodiment, and it is possible to separately form the first reinforcing member 12B and the second reinforcing member 20 on the wiring board 11C (for instance, to form the second reinforcing member 20 after forming the first reinforcing member 12B).

Figure 6:
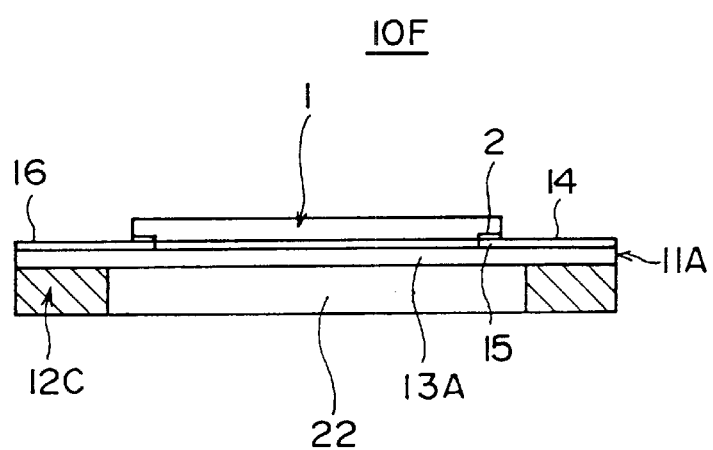
FIG. 6 illustrates a contactor of a sixth embodiment of the present invention.

FIG. 6 illustrates a contactor 10F of a sixth embodiment of the present invention.

Each of the contactors 10A to 10E of the first to fifth embodiments has the flat first reinforcing member 12A or 12B. On the other hand, the contactor 10F of this embodiment has an opening 22 in a first reinforcing member 12C, and the opening 22 faces the area on the wiring board 11A on which the semiconductor device 1 is mounted. The opening 22 has a rectangular shape corresponding to the shape of the semiconductor device 1, and vertically penetrates the first reinforcing member 12C.

The area of the wiring board 11A that faces the opening 22 can be flexible, having no supporting member on its rear surface. If the semiconductor device 1 mounted on the contactor 10F pushes the wiring board 11A facing the opening 22, an elastic restoring force occurs in the wiring board 11A.

The elastic restoring force pushes the device connecting pads 15 formed on the wiring board 11A toward the electrodes 2 of the semiconductor device 1. The device connecting pads 15 are then brought into contact with the electrodes 2 of the semiconductor device 1, thereby surely connecting the semiconductor device 1 and the wiring board 11A.

Figure 7:
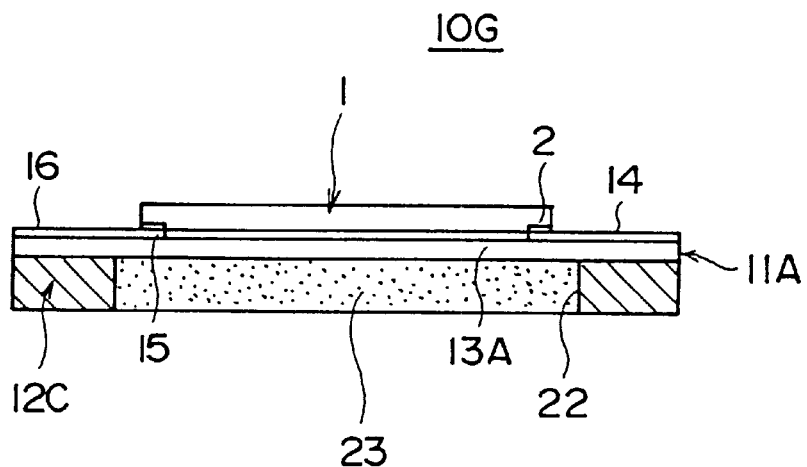
FIG. 7 illustrates a contactor of a seventh embodiment of the present invention.

FIG. 7 illustrates a contactor 10G of a seventh embodiment of the present invention. The contactor 10G of this embodiment is substantially the same as the contactor 10F of the sixth embodiment. The contactor 10G of this embodiment is characterized by a back-up member 23 formed in the opening 22 in the first reinforcing member 12C. The back-up member 23 is made of an elastic material such as elastomer or silicon rubber.

The wiring board 11A has the conductive pattern 14 formed on the base film 13A, and can be easily bent. In the contactor 10F of the sixth embodiment shown in FIG. 6, the wiring board 11A may not be able to endure a pressing force from the semiconductor device 1. Therefore, the back-up member 23 made of an elastic material is disposed in the opening 22 in this embodiment. The back-up member 23 supports the wiring board 11A, so that the wiring board 11A can be protected from a strong pressing force from the semiconductor device 1.

The elasticity of the back-up member 23 can be adjusted as desired, so that the elastic restoring force caused at the time of mounting the semiconductor device 1 on the wiring board 11A can be controlled. Thus, the connection between the device connecting pads 15 formed on the wiring board 11A and the electrodes 2 of the semiconductor device 1 can be made optimum.

Even if there are height variations among the device connecting pads 15 and the electrodes 2 of the semiconductor device 1, such variations are compensated for by elastic deformation of the backup member 23. Excellent connection can be maintained in spite of the height variations.

Figure 8:
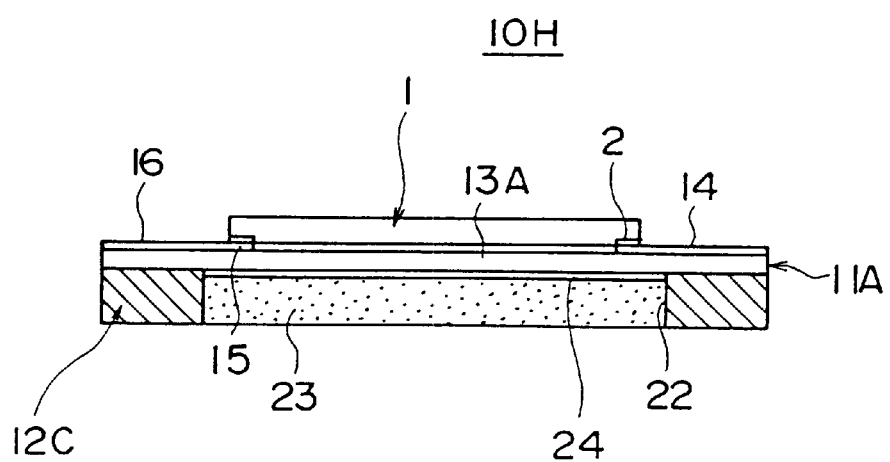
FIG. 8 illustrates a contactor of an eighth embodiment of the present invention.

FIG. 8 illustrates a contactor 10H of an eighth embodiment of the present invention. The contactor 10H has a film member 24 interposed between the wiring board 11A and the back-up member 23. The film member 24 allows relative displacement between the wiring board 11A and the back-up member 23. The film member 24 has thermal resistance and smoothness. For instance, a thermal-resistant fluororesin film can be used for the film member 24.

The film member 24 interposed between the wiring board 11A and the back-up member 23 allows relative displacement between the wiring board 11A and the back-up member 23, so that a stable test can be conducted even if the test involves heating.

If a test involving heating, such as a burn-in test, is conducted on the semiconductor device 1, heat is also applied to the back-up member 23, resulting in thermal expansion or thermal contraction of the back-up member 23. Since an elastic material tends to be greatly deformed by heat, the thermal deformation of the back-up member 23 is large when heat is applied. With the back-up member 23 being directly in contact with the wiring board 11A, thermal deformation of the back-up member 23 might cause deformation of the wiring board 11A.

The film member 24 interposed between the wiring board 11a and the back-up member 23 can prevent the back-up member 23 from adversely influencing the wiring board 11A, because the back-up member 23 slides on the film member 24 when the back-up member 23 is thermally expanded or contracted. Even if the contactor 10H is used for a test involving heating, excellent connection between the wiring board 11A and the semiconductor device 1 can be maintained, and stable testing can be carried out.

Figure 9:
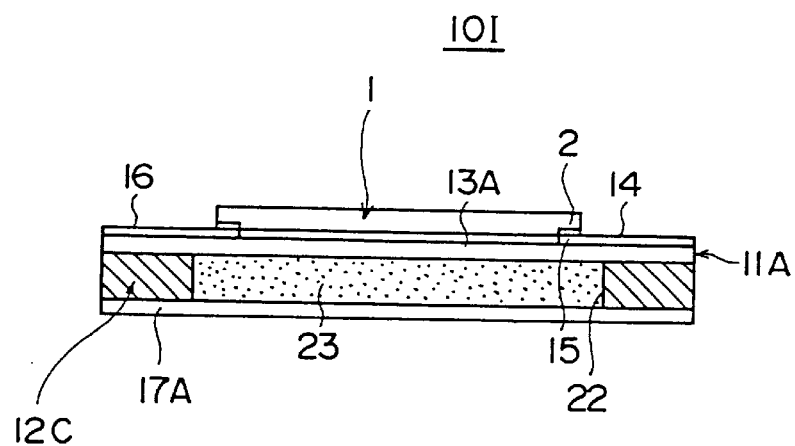
FIG. 9 illustrates a contactor of a ninth embodiment of the present invention.

FIG. 9 illustrates a contactor 10I of a ninth embodiment of the present invention. The contactor 10I is the same as the contactor 10G of the seventh embodiment, except that the core member 17A is bonded to the lower surface of the first reinforcing member 12C.

The core member 17A can be formed on the lower surface of the first reinforcing member 12C having the opening 22. The core member 17A can prevent the wiring board 11A and the first reinforcing member 12C from being deformed.

Figure 10:
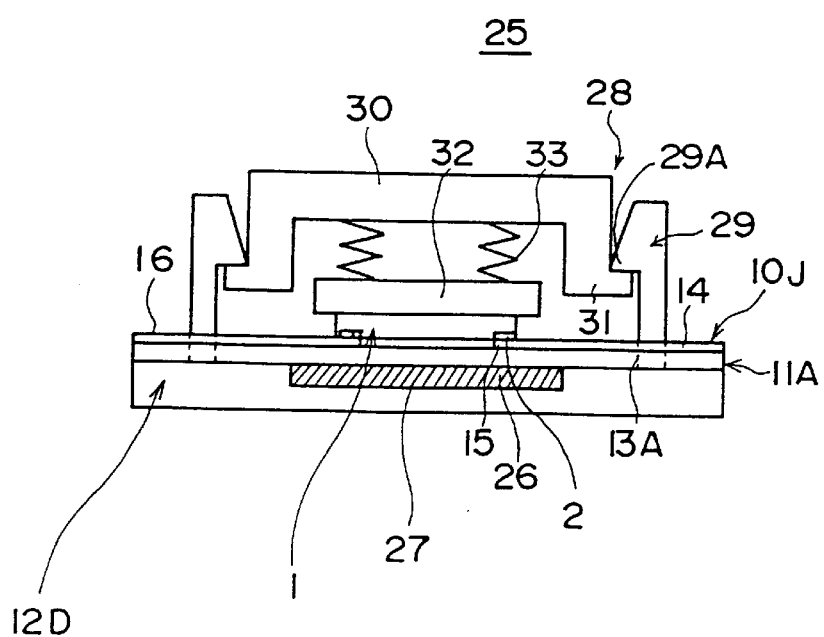
FIG. 10 illustrates a carrier of one embodiment of the present invention.

FIG. 10 illustrates a semiconductor device carrier 25 (hereinafter referred to as the "carrier 25") of one embodiment of the present invention.

The carrier 25 comprises a contactor 10J and a pressure mechanism 28. The contactor 10J includes the wiring board 11A and a first reinforcing member 12D.

The wiring board 11A and the first reinforcing member D are collectively bonded and molded, so that the number of components and the production costs can be reduced, and that the connection reliability with the semiconductor device 1 can be improved. The first reinforcing member 12D has a cushion member 27, and the cushion member 27 faces the semiconductor device 1.

The pressure mechanism 28 includes stopper members 29, a cap 30, a pressure plate 32, and pressure springs 33. The stopper members 29 stand from the first reinforcing member 12D, and have stopper claws 29A at the ends.

The cap covers the semiconductor device 1 mounted on the wiring board 11A, and protects the semiconductor device 1. The cap 30 has a flange 31 extending outward from the lower rim. The flange 31 is engaged with the stopper claws 29A formed on the stopper members 29. The upper ends of the pressure springs 33 are fixed to the roof of the cap 30, and the lower ends of the pressure springs 33 are connected to the pressure plate 32.

To mount the semiconductor device 1 to the carrier 25, the semiconductor device 1 is first mounted to the contactor 10J, with the cap 30 being removed. The cap 30 is then attached to the stopper members 29. Here, the flange 31 is engaged with the stopper claws 29A so as to secure the cap 30, and the pressure plate 32 presses the semiconductor device 1 toward the contactor 10J with the help of the pressure springs 33.

In this manner, the semiconductor device 1 and the contactor 10J can have an excellent connection. Even if the spring force of the pressure springs 33 is too large, the excellent connection between the semiconductor device 1 and the contactor 10J can be maintained by virtue of the flexibility of the cushion member 27 provided on the first reinforcing member 12D that faces the mounted semiconductor device 1. The cushion member 27 can also absorb height irregularities of the electrodes 2 of the semiconductor device 1 and the device connecting pads 15 of the contactor 10J.

Although the contactor 10J having the cushion member 27 is used in this embodiment, any of the contactors 10A to 10I may be used. The carrier 25 of this embodiment has the effects of the contactors 10A to 10I.

Figure 11A:
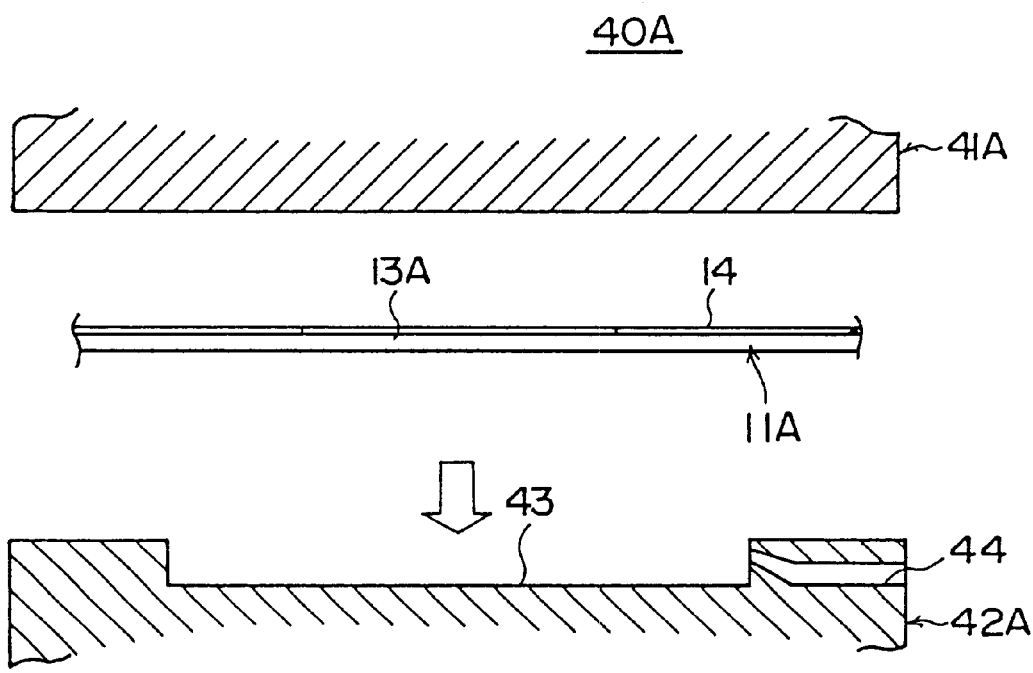
FIGS. 11A to 11C illustrate a method of producing the contactor of the first embodiment of the present invention.
Figure 11B:
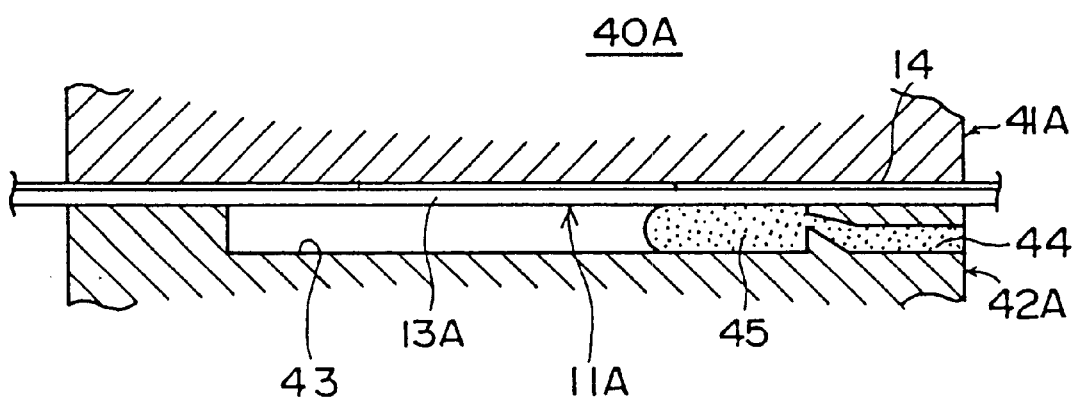
Figure 11C:
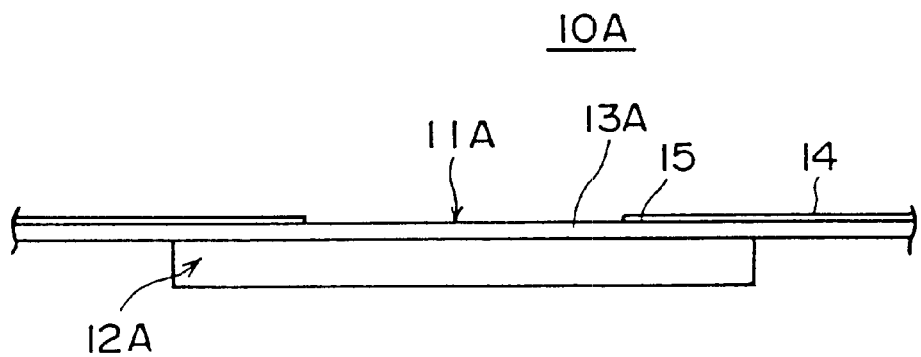

FIGS. 11A to 11C illustrate a method of producing the contactor 10A of the first embodiment shown in FIGS. 1A and 1B. The method of producing the contactor 10A includes a mounting step and a reinforcing member forming step.

FIG. 11A illustrates the mounting step. In this step, the wiring board 11A is mounted to the metal mold 40A. The metal mold 40A is made up of an upper mold 41A and a lower mold 42A. The bottom surface of the upper mold 41A is flat, and the lower mold 42A has a lower mold cavity 43 having a shape corresponding to the shape of the first reinforcing member 12A. Further, a gate 44 which communicates with the lower cavity 43 is formed on one side of the lower mold 42A. The reinforcing material 45 to become the first reinforcing member 12A is introduced through the gate 44.

The wiring board 11A is formed in advance by carrying out a substrate forming step. The wiring board 11A is interposed between the upper mold 41A and the lower mold 42A. The upper mold 41A and the lower mold 42A are clamped by a pressing device (not shown) so as to secure the wiring board 11A.

Positioning holes for positioning the wiring board 11A and the lower cavity 43 may be formed in the wiring board 11A. When attaching the wiring board 11A to the metal mold 40A, the conductive pattern 14 faces the upper mold 41A, and the base film 13A faces the lower mold 42A.

The mounting step is followed by the reinforcing member forming step. FIG. 11B illustrates the reinforcing member forming step. In the reinforcing member forming step, the reinforcing material 45 is injected into the lower cavity 43 through the gate 44 from an injection molding device (not shown). Thus, the reinforcing material 45 injected into the lower cavity 43 is integrally bonded with the wiring board 11A.

The lower cavity 43 filled with the reinforcing material 45 is cooled, and the metal mold 40A is split into the upper mold 41A and the lower mold 42A, thereby completing the contactor 10A shown in FIG. 11C.

As described above, the method of this embodiment eliminates the bonding process required when using double-sided adhesive tape or adhesives, and the fastening process required when using screws. Thus, the production procedures of the contactor 10A can be simplified.

Figure 12:
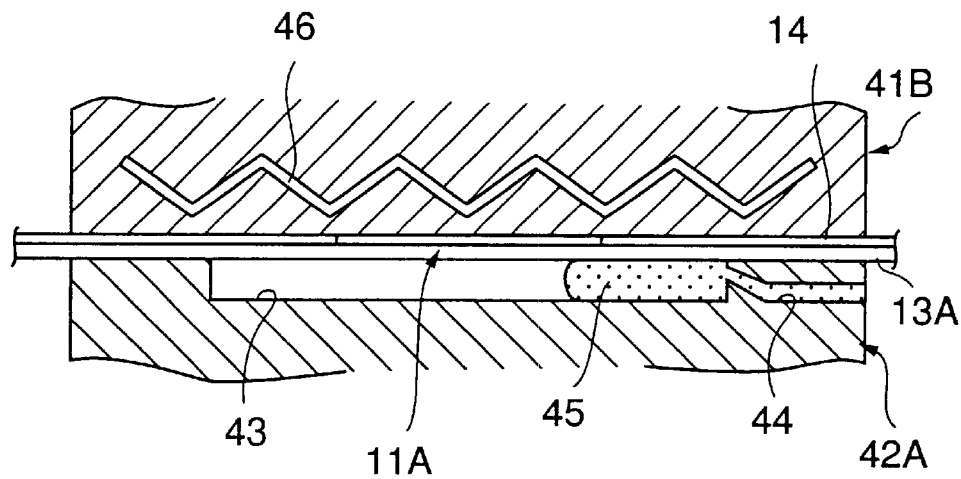
FIG. 12 illustrates a first modification of a metal mold used for producing a contactor.

FIG. 12 illustrates a metal mold 40B which is a first modification of the metal mold 40A.

The metal mold 40B is characterized by a heating and cooling device 46 disposed inside an upper mold 41B. The heating and cooling device 46 heats and cools the upper mold 41B. A control unit (not shown) switches the heating and cooling device 46 between heating and cooling. The control unit also sets a temperature for the device 46.

The heating and cooling device 46 disposed in the metal mold 40B can vary the temperature of heat applied to the wiring board 11A in the reinforcing member forming step. The heating and cooling device 46 can control the temperature of the wiring board 11A, so that the heat expansion of the wiring board 11A becomes larger than the molding contraction of the first reinforcing member 12A at the time of forming the first reinforcing member 12A.

After the formation of the first reinforcing member 12A, the wiring board 11A can always keep tension with the first reinforcing member 12A. Thus, the wiring board 11A can be always flat, and the connection between the semiconductor device 1 and the contactor 10 can be improved.

Figure 13:
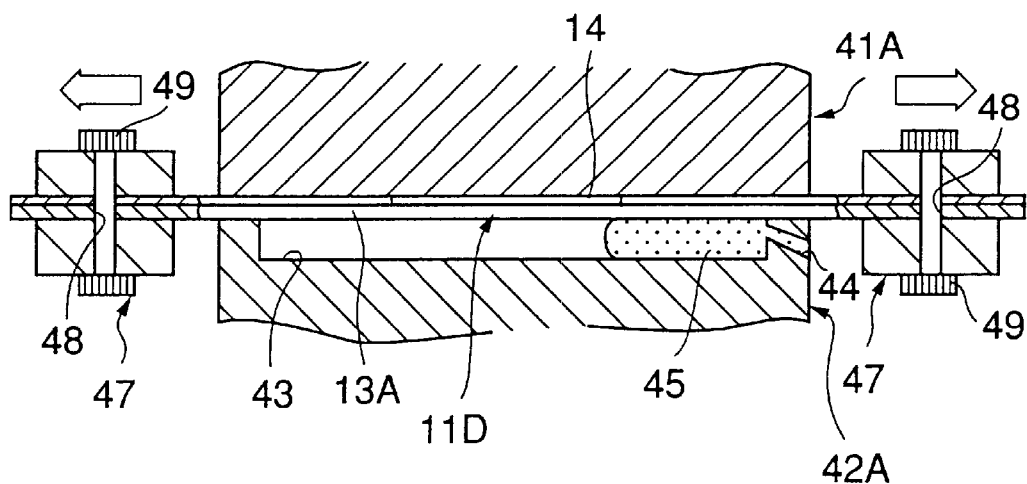
FIG. 13 illustrates a second modification of a metal mold used for producing a contactor.

FIG. 13 illustrates a metal mold 40C which is a second modification of the metal mold 40A.

The metal mold 40C is characterized by tension members 47 provided on both sides. The tension members 47 are moved by a device (not shown) in directions indicated by arrows in the figure. Each of the tension members 47 has fixing screws 49 to be inserted into holes 48 formed in a wiring board 11D.

With the fixing screws 49 inserted into the holes 48 formed in the wiring board 11D, the tension members 47 are moved in the direction indicated by the arrows in the figure, so that the wiring board 11D is pulled.

In the reinforcing member forming step, the first reinforcing member 12A is formed while a tension load is applied to the wiring board 11D by the tension members 47. Thus, the wiring board 11D remains pulled after the formation of the first reinforcing member 12A, thereby maintaining the flatness of the wiring board 11D.

Figure 14A:
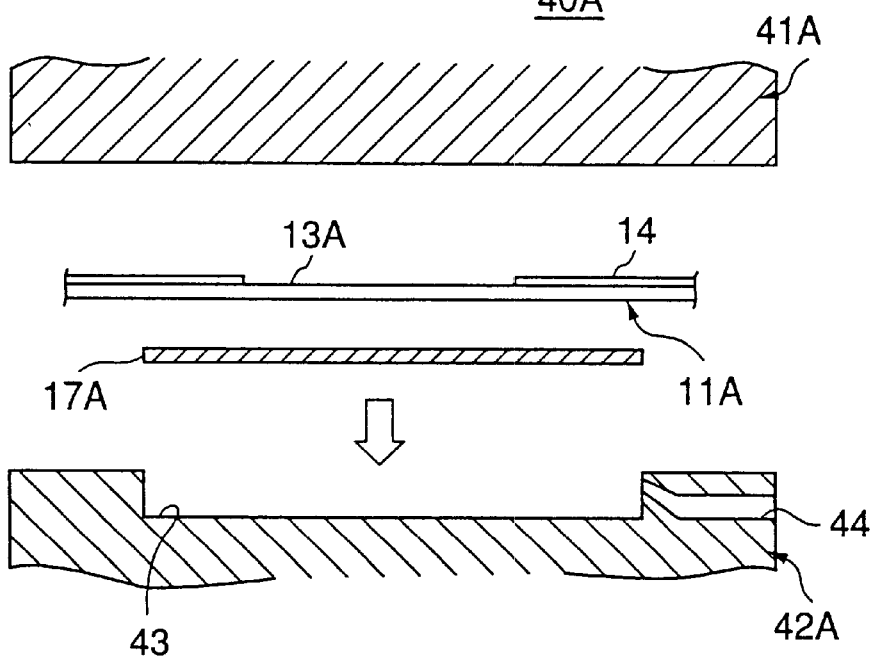
FIGS. 14A to 14C illustrate a method of producing the contactor of the second embodiment of the present invention.
Figure 14B:
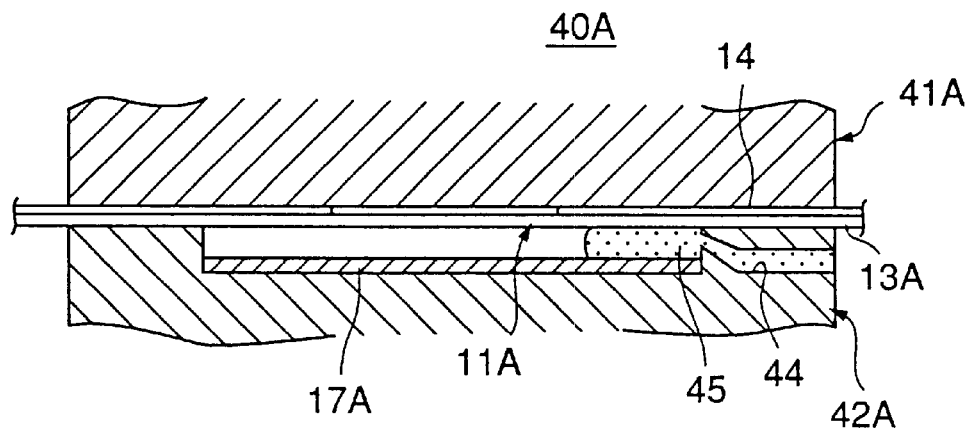
Figure 14C:
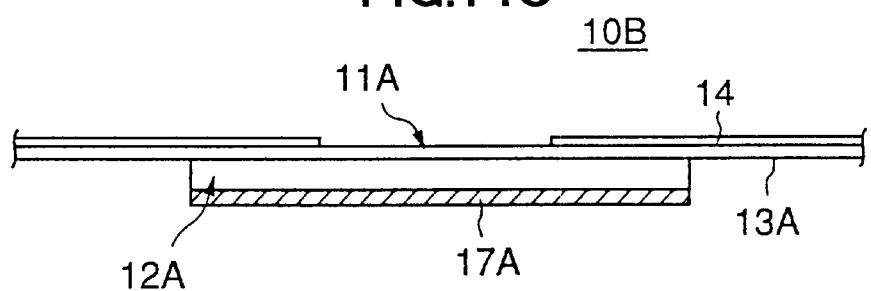

FIGS. 14A to 14C illustrate a method of producing the contactor 10B of the second embodiment of the present invention. In the figures, the same components as in FIGS. 11A to 11C are indicated by the same reference numerals as in FIGS. 11A to 11C. This also applies to other methods shown in FIGS. 15A to 16C to be described later.

The method of this embodiment is characterized by attaching the core member 17A to the bottom surface of the lower cavity 43 in the mounting step. The contactor 10B can be produced by attaching the core member 17A to the lower cavity in the mounting step of the method of producing the contactor 10A. In this manner, the contactor 10A of the first embodiment and the contactor 10B can be produced without changing the metal mold 40A. Thus, the production costs of the metal mold can be reduced, and the production procedures can be simplified.

Figure 15A:
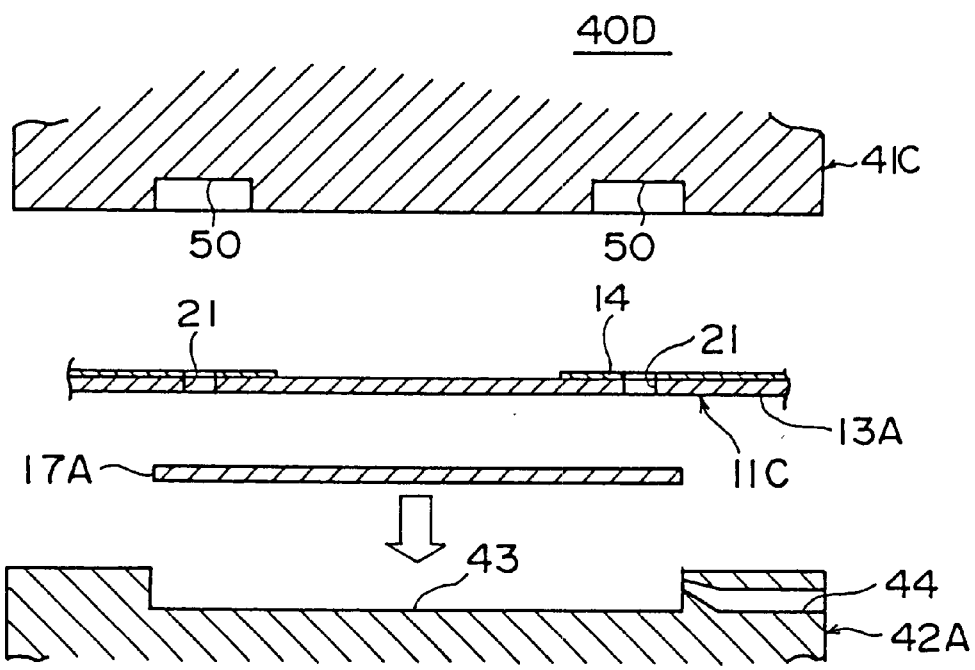
FIGS. 15A to 15C illustrate a method of producing the contactor of the fifth embodiment of the present invention.
Figure 15B:
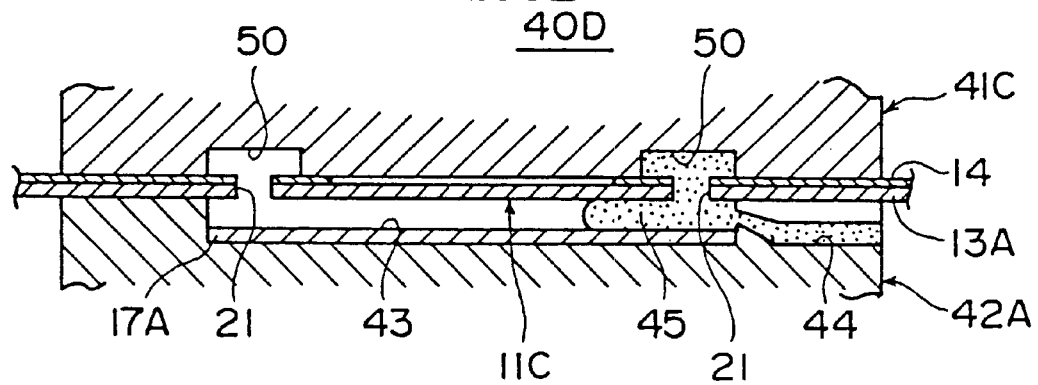
Figure 15C:
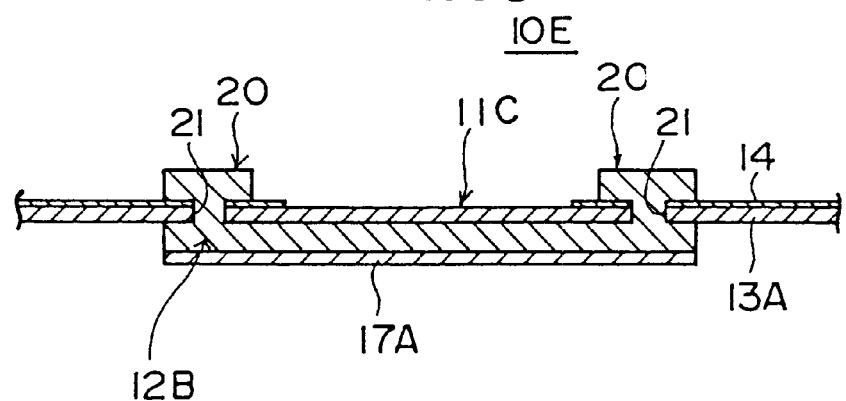

FIGS. 15A to 15C illustrate a method of producing the contactor 10E of the fifth embodiment shown in FIG. 5.

The upper mold 41C of a metal mold 40D used for producing the contactor 10E has an upper cavity 50 having a shape corresponding to the shape of the second reinforcing member 20. The holes 21 are formed in advance in the position where the second reinforcing member 20 is formed on the wiring board 11C.

The contactor 10E is produced by clamping the wiring board 11C between the upper mold 41C and the lower mold 42A, with the upper cavity 50 facing the holes 21 in the mounting step. Here, the core member 17A is placed in the lower cavity 43 in advance.

In the reinforcing member forming step, the reinforcing material 45 is injected into the metal mold 40D, so that the first and second reinforcing members 12B and 20 are collectively bonded with the wiring board 11C. The reinforcing material 45 injected into the lower cavity 43 through the gate 44 of the lower mold 42A also fills the upper cavity 50 through the holes 21.

In the above manner, the contactor 10E having the first reinforcing member 12B and the second reinforcing member 20 integrally formed through the holes 21 is produced. Since the second reinforcing member 20 is collectively bonded with the first reinforcing member 12B and the wiring board 11C, the production procedures is not complicated.

Figure 16A:
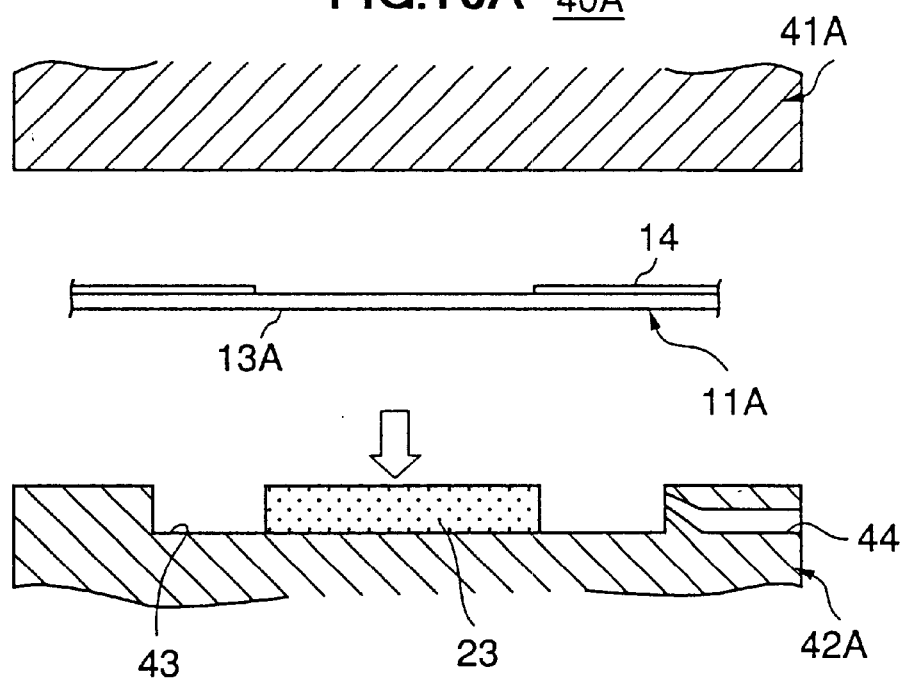
FIGS. 16A to 16C illustrate a method of producing the contactor of the seventh embodiment of the present invention.
Figure 16B:
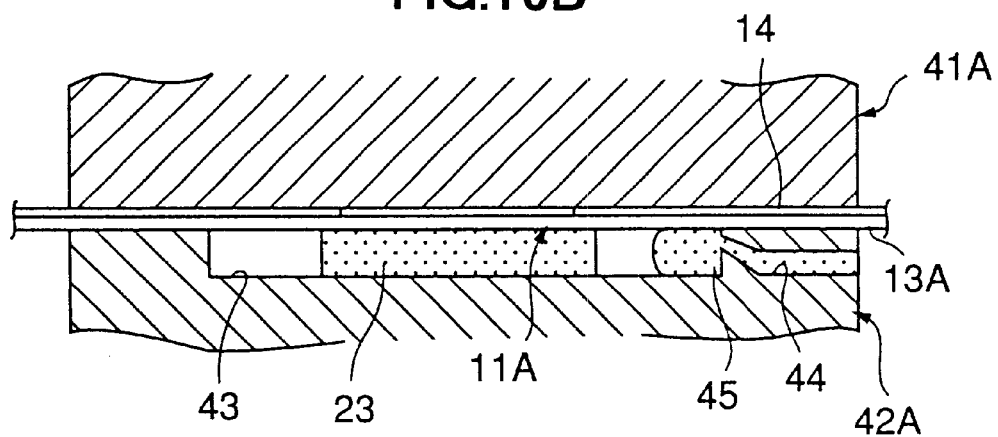
Figure 16C:
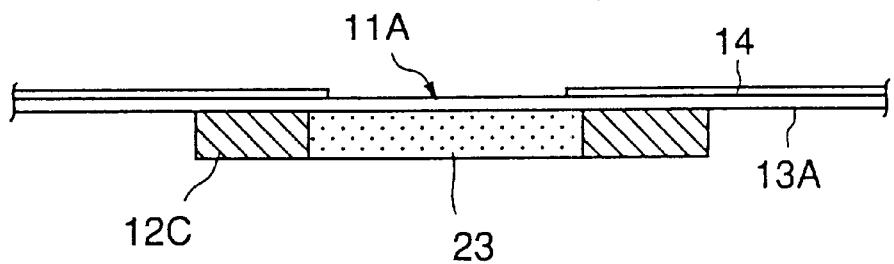

FIGS. 16A to 16C illustrate a method of producing the contactor 10G of the seventh embodiment shown in FIG. 7.

The contactor 10G is produced by using the metal mold 40A as in the methods of producing the contactors of the first and second embodiments. In the mounting step, the back-up member 23 is attached to the bottom surface of the lower cavity 43.

The contactor 10G is produced by simply attaching the back-up member 23 to the lower cavity 43 in the mounting step of the method of producing the contactor 10A of the first embodiment. In this manner, any of the contactors 10A, 10B, and 10G can be produced with the same metal mold 40A. Thus, the production costs of the metal mold can be reduced, and the production procedures can be simplified.

Since the back-up member 23 is made of an elastic material such as rubber, the heat applied to the back-up member 23 in the reinforcing member forming step might cause gas. If the gas remains in the first reinforcing member 12C, the gas turns into a void which lowers the strength of the first reinforcing member 12C. To remove the gas, gas releasing holes may be formed in the wiring board 11A and the upper mold 41A.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

The present application is based on Japanese priority application No. 10-365587, filed on Dec. 22, 1998, the entire contents of which are hereby incorporated by reference.

What is claimed is:

1. A device testing contactor comprising:

a wiring board having a flexible substrate and electrode pads formed on a first surface of the substrate, the electrode pads being electrically connected to electrodes of a device; and a first reinforcing member of a molding formed on a second surface of the substrate opposite to the first surface, said first reinforcing member reinforcing the wiring board at positions where the electrode pads on the first surface of the substrate are connected to the electrodes of the device, wherein the wiring board and the first reinforcing member are collectively bonded and molded.

2. The device testing contactor according to claim 1, further comprising a core member which restricts thermal deformation of the first reinforcing member, wherein the wiring board, the first reinforcing member, and the core member are collectively bonded and molded.

3. The device testing contactor according to claim 2, wherein the core member is provided with anchor portions cutting into the first reinforcing member.

4. The device testing contactor according to claim 1, wherein the wiring board is made of a material which exhibits a thermal expansion greater than a molding contraction of the first reinforcing member when the first reinforcing member is formed by the mold.

5. The device testing contactor according to claim 1, wherein a bonding area increasing portion is formed on a bonding surface of the wiring board to which the first reinforcing member is bonded, so as to increase a bonding area between the wiring board and the first reinforcing member.

6. The device testing contactor according to claim 1, further comprising a second reinforcing member formed on a surface of the wiring board opposite to a surface of the wiring board to which the first reinforcing member is bonded, the second reinforcing member reinforcing the wiring board, wherein the wiring board, the first reinforcing member, and the second reinforcing member are collectively bonded and molded.

7. The device testing contactor according to claim 6, wherein the first reinforcing member and the second reinforcing member are integrally connected via holes formed in the wiring board.

8. The device testing contactor according to claim 1, wherein the wiring board is of a membrane type.

9. The device testing contactor according to claim 1, wherein the first reinforcing member has an opening.

10. The device testing contactor according to claim 9, further comprising a back-up member made of an elastic material in the opening.

11. The device testing contactor according to claim 10, where in a film member is interposed between the wiring board and the back-up member, so that relative displacement is possible between the wiring board and the back-up member.

* * * * *